(12) United States Patent
Hidesaka et al.

(10) Patent No.: US 6,312,863 B1
(45) Date of Patent: Nov. 6, 2001

(54) POSITIVE PHOTORESIST COMPOSITION

(75) Inventors: Shinichi Hidesaka; Atsushi Sawano; Kousuke Doi; Hidekatsu Kohara; Toshimasa Nakayama, all of Kanagawa (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 0 days.

(21) Appl. No.: 09/618,723

(22) Filed: Jul. 18, 2000

(30) Foreign Application Priority Data

Jul. 19, 1999 (JP) ................................. 11-204404

(51) Int. Cl.$^7$ ................................. G03F 7/023; G03F 7/30
(52) U.S. Cl. .................. 430/193; 430/165; 430/191; 430/192; 430/326
(58) Field of Search ....................... 430/165, 191, 430/192, 193, 326

(56) References Cited

U.S. PATENT DOCUMENTS

| | | | |
|---|---|---|---|
| 5,529,881 | * | 6/1996 | Kawabe et al. ............... 430/191 |
| 5,639,587 | * | 6/1997 | Sato et al. ................... 340/190 |
| 5,652,081 | * | 7/1997 | Tan et al. .................... 430/192 |
| 5,700,620 | * | 12/1997 | Sakaguchi et al. ............ 430/191 |
| 5,709,977 | * | 1/1998 | Tan et al. .................... 430/192 |
| 5,728,504 | * | 3/1998 | Hosoda et al. ............... 430/192 |
| 5,912,102 | * | 6/1999 | Kawata et al. ............... 430/191 |
| 6,120,969 | * | 9/2000 | Hagihara et al. ............. 430/191 |

* cited by examiner

*Primary Examiner*—John S. Chu
(74) *Attorney, Agent, or Firm*—Sughrue, Mion, Zinn, Macpeak & Seas, PLLC

(57) ABSTRACT

A positive photoresist composition includes (A) an alkali-soluble resin, and (B) a photosensitizer including an ester of a 1,2-naphthoquinonediazidesulfonyl compound with a compound of the following formula (I). This positive photoresist composition has satisfactory sensitivity, definition, and depth of focus properties, can form both dense patterns and isolation patterns with good shapes in the formation of mixed resist patterns, and can minimize inverted taper shape formation of isolation resist patterns induced by shifts of focal depth to the minus side.

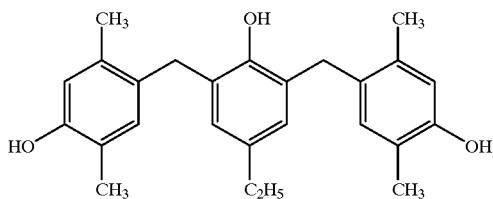

12 Claims, No Drawings

POSITIVE PHOTORESIST COMPOSITION

BACKGROUND OF THE INVENTION

1. Field of the Invention

The present invention relates to a positive photoresist composition having satisfactory sensitivity, definition, and depth of focus (DOF) properties. Particularly, the present invention relates to a positive photoresist composition which can form both dense patterns and isolation patterns with good shapes in the formation of mixed resist patterns including dense patterns and isolation patterns, and can minimize inverted taper shape formation of isolation resist patterns induced by shifts of focal depth to the minus side.

2. Description of the Related Art

In the manufacture of ultralarge-scale integrated circuits (Ultra LSI) where high definition of not more than half a micron, in particular, not more than 0.35 μm is required, demands have been made on photoresist compositions which can form a resist pattern satisfactory in sensitivity, definition, and depth of focus (DOF) properties and having a good shape.

Separately, the manufacture of a highly value-added logic integrated circuit (logic IC) has received attention in recent years. Such a logic IC has a complicated wiring pattern. Specifically, the wiring pattern of the logic IC includes large portions of irregularly formed line-and-space (hereinafter referred to as "L&S"). In contrast, a dynamic random access memory (DRAM) chip includes large portions of regularly formed L&S.

In a photolithographic process using a photoresist composition, demands have been made to form a resist pattern having a good pattern shape not only in regions where L&S is regularly formed, i.e., dense pattern regions, but also in regions where L&S is irregularly formed, i.e., isolation pattern regions.

However, in the formation of an ultrafine resist pattern of not more than half a micrometer, particularly of not more than 0.35 μm, resist patterns having good shapes both in dense patterns and isolation patterns are difficult to form. Specifically, if exposure conditions are changed to yield rectangular dense patterns with good shapes, the shapes of isolation patterns are deteriorated, and, in contrast, if exposure conditions are changed to yield rectangular isolation patterns with good shapes, the shapes of dense patterns are deteriorated.

Accordingly, mixed resist patterns with good shapes including both dense patterns and isolation patterns are difficult to form concurrently.

In addition, positive photoresist compositions are liable to invite inverted taper shapes of isolation patterns, which is caused by shifts of focal depth to the minus side, and are liable to induce pattern twist, and have deteriorated depth of focus (DOF) properties in isolation patterns.

Japanese Patent Laid-Open No. 2-296249 (conventional technique 1) describes a positive photoresist composition including, as a photosensitizer, a quinonediazidesulfonyl ester of a compound of the following formula:

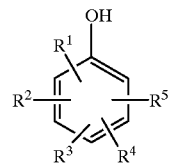

wherein each of $R^1$ to $R^5$ is hydrogen, halogen, a $C_1$–$C_4$ alkyl group, an alkenyl group, an alkoxy group or a hydroxyl group, where at least one is a group of the following formula:

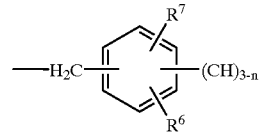

wherein each of $R^6$ and $R^7$ is halogen, an alkyl group, or an alkenyl group, and n is 0, 1, or 2.

Compounds of the formula (I) for use in the invention as described below are included in compounds of the above general formula, but the conventional technique 1 lacks specific descriptions of the structures of the compounds of the formula (I).

With the photoresist composition exemplified in conventional technique 1 it is difficult to form either dense patterns or isolation patterns with good shapes in the formation of mixed resist patterns. In particular, this photoresist composition cannot effectively minimize inverted taper shape formation of isolation resist patterns induced by shifts of focal depth to the minus side.

Japanese Patent Laid-Open No. 5-323597 (conventional technique 2) describes a positive photoresist composition including, as a photosensitizer, a quinonediazidesulfonyl diester of a compound of the following formula:

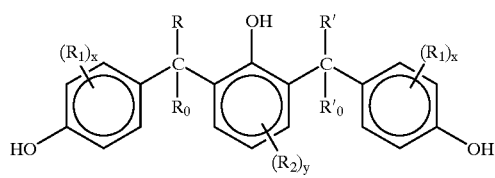

or

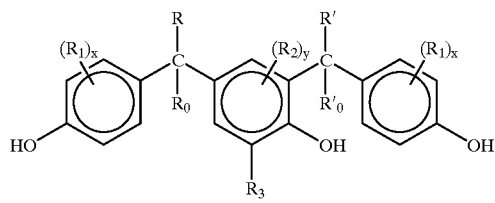

wherein each of $R_1$ and $R_2$ is independently a hydrogen or halogen atom, —$OCOR_3$, or an alkyl or alkoxy group which may be substituted, $R_3$ is an alkyl or phenyl group which may be substituted, each of x and y is independently an integer of 1 to 3, and each of R, $R_0$, R', and $R_0'$ is independently a hydrogen atom, an alkyl or phenyl group.

Compounds of the formula (I) for use in the invention as described below are included in compounds of the above general formula, but the conventional technique 2 lacks specific descriptions of the structures of the compounds of the formula (I).

With the photoresist composition exemplified in conventional technique 2 it is difficult to form either dense patterns or isolation patterns with good shapes in the formation of mixed resist patterns. In particular, this photoresist composition cannot effectively minimize inverted taper shape formation of isolation resist patterns induced by shifts of focal depth to the minus side.

SUMMARY OF THE INVENTION

Accordingly, an object of the present invention is to provide a positive photoresist composition for use in the formation of an ultrafine resist pattern of not more than half a micrometer, particularly of not more than 0.35 μm. This positive photoresist composition has satisfactory sensitivity, definition, and depth of focus (DOF) properties, can form dense patterns and isolation patterns both with good shapes in the concurrent formation of mixed resist patterns, and can minimize inverted taper shape formation of isolation resist patterns induced by shifts of focal depth to the minus side.

The present invention has been accomplished based on intensive investigations made by the present inventors to achieve the above object.

Specifically, the present invention provides a positive photoresist composition which includes (A) an alkali-soluble resin and (B) a photosensitizer, and the photosensitizer (B) includes an ester of a 1,2-naphthoquinonediazidesulfonyl compound with a compound of the following formula (I):

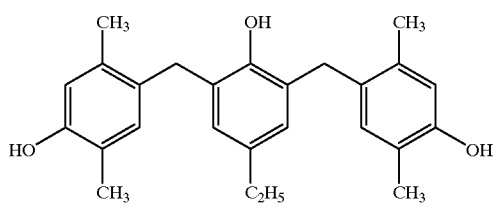
(I)

The positive photoresist composition may preferably further include (C) a sensitizer (intensifier).

The ingredient (B) may preferably further include an ester of a 1,2-naphthoquinonediazidesulfonyl compound with bis [2,5-dimethyl-3-(2-hydroxy-5-methylbenzyl)-4-hydroxyphenyl]methane of the following formula (II):

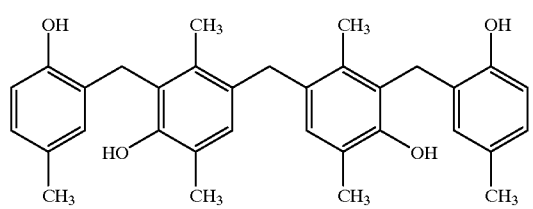
(II)

Preferably, the ingredient (B) may further include an ester of a 1,2-naphthoquinonediazidesulfonyl compound with bis (3-cyclohexyl-4-hydroxy-6-methylphenyl)-3,4-dihydroxyphenylmethane of the following formula (III):

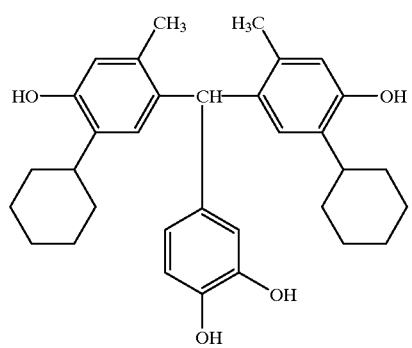
(III)

The proportion of the ingredient (B) preferably ranges from 10 to 60% by weight relative to the total weight of the ingredient (A) and the ingredient (C), which ingredient (C) is added according to necessity.

The ingredient (B) preferably includes 10% by weight or more of a diester of a 1,2-naphthoquinonediazidesulfonyl compound with the compound of the formula (I) based on the total weight of the ingredient (B).

DESCRIPTION OF THE PREFERRED EMBODIMENT

[(A) Alkali-soluble Resin]

Alkali-soluble resins for use as the ingredient (A) are not limited and can be chosen from those generally used as film-forming substances in positive photoresist compositions. Of these resins, condensates of aromatic hydroxy compounds and aldehydes or ketones, polyhydroxystyrenes and their derivatives are preferable.

Such aromatic hydroxy compounds include, but are not limited to, phenol, m-cresol, p-cresol, o-cresol, 2,3-xylenol, 2,5-xylenol, 3,5-xylenol, 3,4-xylenol, and other xylenols; m-ethylphenol, p-ethylphenol, o-ethylphenol, 2,3,5-trimethylphenol, 2,3,5-triethylphenol, 4-tert-butylphenol, 3-tert-butylphenol, 2-tert-butylphenol, 2-tert-butyl-4-methylphenol, 2-tert-butyl-5-methylphenol, and other alkyl-substituted phenols; p-methoxyphenol, m-methoxyphenol, p-ethoxyphenol, m-ethoxyphenol, p-propoxyphenol, m-propoxyphenol, and other alkoxy-substituted phenols; o-isopropenylphenol, p-isopropenylphenol, 2-methyl-4-isopropenylphenol, 2-ethyl-4-isopropenylphenol, and other isopropenyl-substituted phenols; phenylphenol, and other aryl-substituted phenols; 4,4'-dihydroxybiphenyl, bisphenol A, resorcinol, hydroquinone, pyrogallol, and other polyhydroxyphenols. Each of these aromatic hydroxy compounds can be used alone or in combination.

The aldehydes include, but are not limited to, formaldehyde, paraformaldehyde, trioxane, acetaldehyde, propionaldehyde, butylaldehyde, trimethylacetaldehyde, acrolein (acrylaldehyde), crotonaldehyde, cyclohexanaldehyde, furfural, furylacrolein, benzaldehyde, terephthalaldehyde, phenylacetaldehyde, α-phenylpropylaldehyde, β-phenylpropylaldehyde, o-hydroxybenzaldehyde, m-hydroxybenzaldehyde, p-hydroxybenzaldehyde, o-methylbenzaldehyde, m-methylbenzaldehyde, p-methylbenzaldehyde, o-chlorobenzaldehyde, m-chlorobenzaldehyde, p-chlorobenzaldehyde, and cinnamaldehyde. Each of these aldehydes can be used alone or in combination. Of these aldehydes, formaldehyde is desirable for its availability. Particularly, to improve heat resistance, the combination use of a hydroxybenzaldehyde and formaldehyde is preferred.

The ketones include, for example, acetone, methyl ethyl ketone, diethyl ketone, and diphenyl ketone. Each of these ketones may be used alone or in combination. Further, an optional combination of an aldehyde and a ketone can be employed.

The condensate of an aromatic hydroxy compound and an aldehyde or a ketone can be prepared in the presence of an acidic catalyst according to a known technique. Such acidic catalysts include, but are not limited to, hydrochloric acid, sulfuric acid, formic acid, oxalic acid, and p-toluenesulfonic acid.

The polyhydroxystyrenes and their derivatives include, for example, vinylphenol homopolymers, copolymers of vinylphenol and a copolymerizable comonomer. Such comonomers include, for example, acrylic acid derivatives, acrylonitrile, methacrylic acid derivatives, methacrylonitrile, styrene, α-methylstyrene, p-methylstyrene, o-methylstyrene, p-methoxystyrene, p-chlorostyrene, and other styrene derivatives.

Of these alkali-soluble resins for use in the present invention as the ingredient (A), alkali-soluble novolak resins comprising at least two aromatic hydroxy compounds selected from m-cresol, p-cresol and 2,5-xylenol and having a weight average molecular weight (Mw) of 2000 to 25000, and typically 4000 to 10000 are advantageously used.

Incidentally, low molecular weight fractions of the alkali-soluble novolak resins for use as the ingredient (A) should be preferably removed. Such low molecular weight fractions can be removed by any process, and preferably in the following manner. A novolak resin solution is dissolved in methyl amyl ketone (MAK), and the resulting mixture is washed with water to remove any catalyst and unreacted materials. To the resulting mixture, a poor solvent is added and the mixture is then stirred and is allowed to stand to separate a poor solvent layer as an upper layer, and a MAK layer as a lower layer. The upper layer contains low molecular weight fractions, and the lower layer contains high molecular weight fractions. By extracting the lower layer, a high molecular weight novolak resin can be obtained. Such poor solvents include, for example, hexane or heptane, a mixture of hexane and MAK, or a mixture of heptane and MAK,

[(B) Photosensitizer]

The inventive positive photoresist composition comprises, as the photosensitizer (B), an ester of a 1,2-naphthoquinonediazidesulfonyl compound with a compound of the following formula (I):

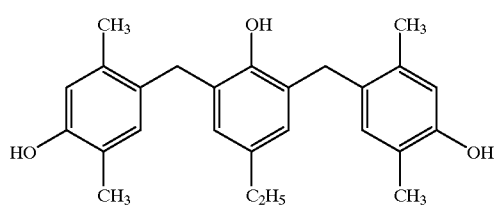

(I)

Such esters can be prepared by condensation reacting a 1,2-naphthoquinonediazidesulfonyl compound with the compound of formula (I) for complete esterification or partial esterification. Such 1,2-naphthoquinonediazidesulfonyl compounds include, but are not limited to, 1,2-naphthoquinonediazide-4-sulfonyl halide and 1,2-naphthoquinonediazide-5-sulfonyl halide. The condensation reaction can be generally performed in an organic solvent in the presence of a basic condensing agent. Such organic solvents include, for example, dioxane, N-methylpyrrolidone, and dimethylacetamide, and such basic condensing agents include, for example, triethylamine, alkali carbonates, and alkali hydrogencarbonates.

The content of the ester in ingredient (B) is preferably 15% by weight or more, and more preferably 35% by weight or more. If the content is less than 15% by weight, the resulting positive photoresist composition may not effectively minimize inverted taper shape formation of isolation patterns induced by shifts of focal depth to the minus side. The esters include monoesters in which one of three hydroxyl groups of the compound of formula (I) is esterified, diesters in which two hydroxyl groups are esterified, and triesters in which three hydroxyl groups are esterified. Of these esters, diesters are preferred.

Such diesters can be selectively synthetically obtained by reacting one mole of the compound of the formula (I) with about two moles of the 1,2-naphthoquinonediazidesulfonyl compound in the above condensation reaction. The yield of the diester in this procedure is about 70 to 85% in the overall esterified products.

The ingredient (B) should preferably include 10% by weight or more, typically 20% by weight or more of the diester based on the total weight of ingredient (B). If the content of the diester in ingredient (B) is less than 10% by weight, the resulting positive photoresist composition may not effectively minimize inverted taper shape formation of isolation patterns induced by shifts of focal depth to the minus side.

To further improve sensitivity and definition, ingredient (B) may further comprise esters of 1,2-naphthoquinonediazidesulfonyl compounds and phenol compounds other than the compounds of formula (I). Such phenol compounds include, for example, polyphenol compounds of the following formula (IV):

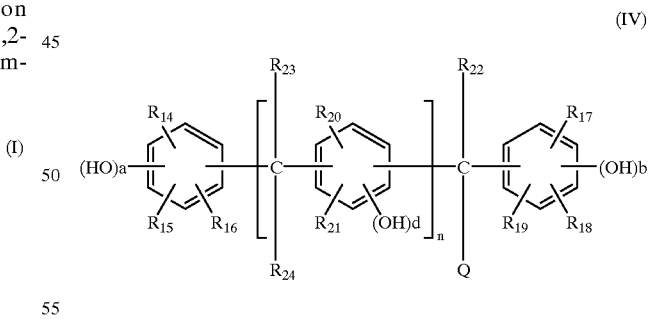

(IV)

wherein each of $R^{14}$ to $R^{21}$ is independently a hydrogen atom, a halogen atom, an alkyl group having 1 to 6 carbon atoms, an alkoxy group having 1 to 6 carbon atoms, or a cycloalkyl group; each of $R^{22}$ to $R^{24}$ is independently a hydrogen atom or an alkyl group having 1 to 6 carbon atoms; Q is a hydrogen atom, an alkyl group having 1 to 6 carbon atoms, a cyclic ring having 3 to 6 carbon atoms as members as combined with $R^{22}$, or a residue (V) of the following formula (V); each of a and b is an integer of 1 to 3; d is an integer of 0 to 3; and n is an integer of 0 to 3:

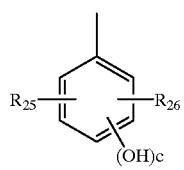

(V)

wherein each of $R^{25}$ and $R^{26}$ is independently a hydrogen atom, a halogen atom, an alkyl group having 1 to 6 carbon atoms, an alkoxy group having 1 to 6 carbon atoms, or a cycloalkyl group; and c is an integer of 1 to 3. The combined use of any of esters of 1,2-naphthoquinonediazidesulfonyl compounds and these polyphenol compounds with the ester of a 1,2-naphthoquinonediazidesulfonyl compound with a phenol compound of formula (I) will provide high sensitivity and high definition.

Preferred examples of the polyphenol compounds include linear polyphenol compounds such as 2,4-bis(3,5-dimethyl-4-hydroxybenzyl)-5-hydroxyphenol, 2,6-bis(2,5-dimethyl-4-hydroxybenzyl)-4-methylphenol, and other linear tri-nuclear compounds; bis[2,5-dimethyl-3-(4-hydroxy-5-methylbenzyl)-4-hydroxyphenyl]methane, bis[2,5-dimethyl-3-(4-hydroxybenzyl)- 4-hydroxyphenyl]methane, bis[3-(3,5-dimethyl-4-hydroxybenzyl)-4-hydroxy-5-methylphenyl]methane, bis[3-(3,5-dimethyl-4-hydroxybenzyl)-4-hydroxy-5-ethylphenyl]methane, bis[3-(3,5-diethyl-4-hydroxybenzyl)-4-hydroxy-5-methylphenyl]methane, bis[3-(3,5-diethyl-4-hydroxybenzyl)-4-hydroxy-5-ethylphenyl]methane, bis[2-hydroxy-3-(3,5-dimethyl-4-hydroxybenzyl)-5-methylphenyl]methane, bis[2-hydroxy-3-(2-hydroxy-5-methylbenzyl)-5-methylphenyl]methane, bis[4-hydroxy-3-(2-hydroxy-5-methylbenzyl)-5-methylphenyl]methane, and other linear tetranuclear compounds; 2,4-bis[2-hydroxy-3-(4-hydroxybenzyl)-5-methylbenzyl]-6-cyclohexylphenol, 2,4-bis[4-hydroxy-3-(4-hydroxybenzyl)-5-methylbenzyl]-6-cyclohexylphenol, and other linear pentanuclear compounds; and trisphenolic polyphenol compounds such as tris(4-hydroxyphenyl) methane, bis(4-hydroxy-3,5-dimethylphenyl)-4-hydroxyphenylmethane, bis(4-hydroxy-3,5-dimethylphenyl)-3-hydroxyphenylmethane, bis(4-hydroxy-3,5-dimethylphenyl)-2-hydroxyphenylmethane, bis(4-hydroxy-2,5-dimethylphenyl)-4-hydroxyphenylmethane, bis(4-hydroxy-2,5-dimethylphenyl)-3-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-3,5-dimethylphenyl)-2,4-dihydroxyphenylmethane, bis(4-hydroxy-2,5-dimethylphenyl)-2,4-dihydroxyphenylmethane, bis(4-hydroxyphenyl)-3-methoxy-4-hydroxyphenylmethane, bis(3-cyclohexyl-4-hydroxyphenyl)-3-hydroxyphenylmethane, bis(3-cyclohexyl-4-hydroxyphenyl)-2-hydroxyphenylmethane, bis(3-cyclohexyl-4-hydroxyphenyl)-4-hydroxyphenylmethane, bis(3-cyclohexyl-4-hydroxy-6-methylphenyl)-2-hydroxyphenylmethane, bis(3-cyclohexyl-4-hydroxy-6-methylphenyl)-3-hydroxyphenylmethane, bis(3-cyclohexyl-4-hydroxy-6-methylphenyl)-4-hydroxyphenylmethane, bis(3-cyclohexyl-4-hydroxy-6-methylphenyl)-3,4-dihydroxyphenylmethane, bis(3-cyclohexyl-6-hydroxyphenyl)-3-hydroxyphenylmethane, bis(3-cyclohexyl-6-hydroxyphenyl)-4-hydroxyphenylmethane, bis(3-cyclohexyl-6-hydroxyphenyl)-2-hydroxyphenylmethane, bis(3-cyclohexyl-6-hydroxy-4-methylphenyl)-2-hydroxyphenylmethane, bis(3-cyclohexyl-6-hydroxy-4-methylphenyl)-4-hydroxyphenylmethane, bis(3-cyclohexyl-6-hydroxy-4-methylphenyl)-3,4-dihydroxyphenylmethane, bis(4-hydroxy-2,3,5-trimethylphenyl)-2-hydroxyphenylmethane, bis(4-hydroxy-2,3,5-trimethylphenyl)-3-hydroxyphenylmethane, bis(4-hydroxy-2,3,5-trimethylphenyl)-4-hydroxyphenylmethane, bis(4-hydroxy-2,3,5-trimethylphenyl)-3,4-dihydroxyphenylmethane, bis(4-hydroxy-2,3,5-trimethylphenyl)-4-hydroxy-3-methoxyphenylmethane.

Of these esters, typically preferred esters from the viewpoint of higher definition are esters of bis[2,5-dimethyl-3-(2-hydroxy-5-methylbenzyl)-4-hydroxyphenyl]methane of the formula (II):

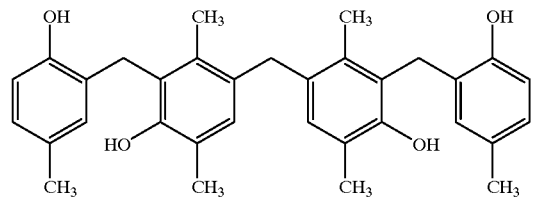

(II)

and esters of bis(3-cyclohexyl-4-hydroxy-6-methylphenyl)-3,4-dihydroxyphenylmethane of the formula (III):

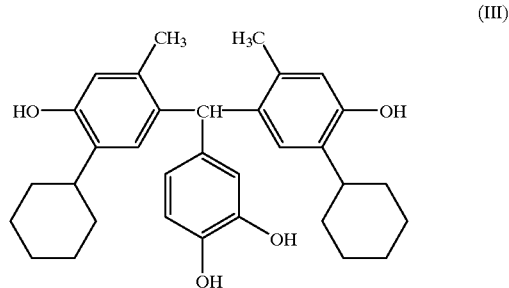

(III)

The proportion of the ingredient (B) in the invented composition of the present invention is preferably 10 to 60% by weight, and more preferably 20 to 50% by weight relative to the total weight of the alkali-soluble resin ingredient (A), and the sensitizer (intensifier) ingredient (C) added according to necessity. If the proportion of ingredient (B) is less than the above range, images in exact accordance with mask patterns cannot be obtained, and transferring property is deteriorated. In contrast, if the proportion exceeds the above specified range, sensitivity and uniformity of the resulting resist film tend to be deteriorated to thereby deteriorate definition.

[(C) Sensitizer (Intensifier)]

Sensitizers (intensifiers) for use as ingredient (C) in the present invention are not limited, and any known sensitizers can be used. Such sensitizers include, but are not limited to, polyphenyl compounds of formula (IV) above. Of these compounds, preferred compounds are, for example, bis(4-hydroxy-2,3,5-trimethylphenyl)-2-hydroxyphenylmethane, 1,4-bis[1-(3,5-dimethyl-4-hydroxyphenyl)isopropyl]benzene, 2,4-bis(3,5-dimethyl-4-hydroxyphenylmethyl)-6-methylphenol, bis(4-hydroxy-3,5-dimethylphenyl)-2-hydroxyphenylmethane, bis(4-hydroxy-2,5-dimethylphenyl)-2-hydroxyphenylmethane, bis(4-hydroxy- 3,5-dimethylphenyl)-3,4-dihydroxyphenylmethane, 1-[1-(4-hydroxyphenyl)isopropyl]-4-[1,1-bis(4-hydroxyphenyl) ethyl]benzene, 1-[1-(3-methyl-4-hydroxyphenyl)isopropyl]-4-[1,1-bis(3-methyl-4-hydroxyphenyl)ethyl]benzene, 2,6-bis[1-(2,4-dihydroxyphenyl)isopropyl]-4-methylphenol, 4,6-bis[1-(4-hydroxyphenyl)isopropyl]resorcin, 4,6-bis(3,5-dimethoxy-4-hydroxyphenylmethyl)pyrogallol, 4,6-bis(3,5-dimethyl-4-hydroxyphenylmethyl)pyrogallol, 2,6-bis(3-methyl-4,6-dihydroxyphenylmethyl)-4-methylphenol, 2,6-bis(2,3,4-trihydroxyphenylmethyl)-4-methylphenol, and 1,1-bis(4-hydroxyphenyl)cyclohexane. Among them, bis(4-hydroxy-2,3,5-trimethylphenyl)-2-hydroxyphenylmethane, bis(4-hydroxy-3,5-dimethylphenyl)-3,4-dihydroxyphenylmethane, 2,4-bis(3,5-dimethyl-4-hydroxyphenylmethyl)-6-methylphenol, and 4,6-bis[1-(4-hydroxyphenyl)isopropyl]resorcin are typically preferred.

When ingredient (C) is incorporated in the composition of the present invention, the content of the ingredient (C) is preferably 5 to 50% by weight, and more preferably 10 to 35% by weight relative to the weight of the alkali soluble resin ingredient (A). The use of the sensitizer (intensifier) (C) within the above range is preferred to further improve exposure margin, definition, and depth of focus properties, and to provide a satisfactory sensitivity.

Where necessary, the invented composition of the present invention may further comprise any of compatible additives including, for example, ultraviolet absorbents for inhibition of halation and surfactants for prevention of striation within a range not adversely affecting the advantages of the present invention. Such ultraviolet absorbents include, for example, 2,2',4,4'-tetrahydroxybenzophenone, 4-dimethylamino-2',4'-dihydroxybenzophenone, 5-amino-3-methyl-1-phenyl-4-(4-hydroxyphenylazo)pyrazole, 4-dimethylamino-4'-hydroxyazobenzene, 4-diethylamino-4'-ethoxyazobenzene, 4-diethylaminoazobenzene and curcumin. Illustrative surfactants are, for example, available as Fluorade FC-430 and FC-431 (trade names, manufactured by Sumitomo 3M Ltd., Japan), F-TOP EF122A, EF122B, EF122C and EF126 (trade names, manufactured by Tochem Products Ltd., Japan), and other fluorine-containing surfactants.

The composition of the present invention may preferably be used as a solution prepared by dissolving ingredients (A), (B) and (C), and each of any additional ingredients added according to necessity, in an appropriate solvent. Such solvents include solvents conventionally used for positive photoresist compositions, such as acetone, methyl ethyl ketone, cyclohexanone, methyl isoamyl ketone, 2-heptanone, and other ketones; ethylene glycol, propylene glycol, diethylene glycol, ethylene glycol monoacetate, propylene glycol monoacetate, diethylene glycol monoacetate, or their monomethyl ethers, monoethyl ethers, monopropyl ethers, monobutyl ethers or monophenyl ethers, and other polyhydric alcohols and their derivatives; dioxane, and other cyclic ethers; and ethyl lactate, methyl acetate, ethyl acetate, butyl acetate, methyl pyruvate, ethyl pyruvate, methyl methoxypropionate, ethyl ethoxypropionate, and other esters. Each of these solvents can be used alone or in combination. Particularly, acetone, methyl ethyl ketone, cyclohexanone, methyl isoamyl ketone, 2-heptanone, and other ketones; ethyl lactate, methyl acetate, ethyl acetate, butyl acetate, methyl pyruvate, ethyl pyruvate, methyl methoxypropionate, ethyl ethoxypropionate, and other esters are desirable.

Practically, the composition of the present invention may be used, for example, in the following manner. Each of the ingredients (A), (B) and (C), and other ingredients added according to necessity is dissolved in an appropriate solvent as mentioned above to yield a coating solution; the coating solution is then applied, using a spinner or the like, onto a substrate such as a silicon wafer or a substrate on which an antireflection coating has been formed, and is then dried to form a photosensitive layer; next, the photosensitive layer is irradiated and exposed with an ultraviolet source such as a low-pressure mercury lamp, a high-pressure mercury lamp, an ultra-high-pressure mercury lamp, an arc lamp, or a xenon lamp, through a desired mask pattern, or irradiated with a scanning electron beam; and the exposed portions of the film are then dissolved and removed by dipping the substrate in a developer solution, for example, an alkaline aqueous solution such as a 1% to 10% by weight tetramethylammonium hydroxide (TMAH) aqueous solution, thus forming an image that is in exact accordance with the mask pattern.

As thus described, the present invention can provide a positive photoresist composition having satisfactory sensitivity, definition, and depth of focus (DOF) properties. This composition can form resist patterns with good shapes in the formation of mixed resist patterns including both dense patterns and isolation patterns, and can minimize inverted taper shape formation of isolation resist patterns induced by shifts of focal depth to the minus side.

The present invention will be further illustrated in detail with reference to several invented examples and comparative examples below which are not intended to limit the scope of the present invention.

Each of the characteristics of the positive photoresist compositions was evaluated according to the following manner, respectively, and the results are shown in Table 2.

(1) Sensitivity

A sample was applied on to a silicon wafer using a spinner, and was dried on a hot plate at 90° C. for 90 s to form a resist film having a thickness of 1.05 $\mu$m. The resist film was then irradiated through a mask (reticle) corresponding to a 0.35-$\mu$m resist pattern with a line-and-space (L&S) of 1:1 for an increasing period from 0.1 s at intervals of 0.01 s using a reducing-type projection aligner NSR-2005i10D (manufactured by Nikon Corporation, Japan; NA=0.57). The film was then post-exposure baked (PEB) at 110° C. for 90 s subjected to developing in a 2.38% by weight tetramethylammonium hydroxide aqueous solution at 23° C. for 60 s washed with water for 30 s, and dried. In this procedure, the sensitivity was defined as the exposure time period (Eop) [millisecond (ms)] to yield a 0.35-$\mu$m resist pattern with a line-and-space (L&S) width of 1:1.

(2-1) Depth of Focus Properties (Isolation Pattern)

A sample was subjected to exposure and development using a reducing-type projection aligner NSR-2005i10D (manufactured by Nikon Corporation, Japan; NA=0.57) at an exposure of Eop [the exposure time period to reproduce the set dimensions of the mask pattern (line width 0.35 $\mu$m, line-and-space (L&S) 1:1)] as a standard exposure, where the focus was shifted up and down at this exposure. The obtained isolation resist pattern was subjected to scanning electron microscope (SEM) photographic observation. Based upon the SEM photograph, the focal depth range properties were defined as the maximum value ($\mu$m) of the focal shift (defocus) to obtain a 0.35-$\mu$m rectangular isolation resist pattern within a variation of ±10% of the set dimensions.

(2-2) Depth of Focus Properties (Dense Pattern)

A sample was subjected to exposure and development using a reducing-type projection aligner NSR-2005i10D (manufactured by Nikon Corporation, Japan; NA=0.57) at an exposure of Eop [the exposure time period to reproduce the set dimensions of the mask pattern (line width 0.35 μm, line-and-space (L&S) 1:1)] as a standard exposure, where the focus was shifted up and down at this exposure. The obtained dense resist pattern (line width 0.35 μm, line-and-space (L&S) 1:1) was subjected to SEM photographic observation. Based upon the SEM photograph, the focal depth range properties were defined as the maximum value (μm) of the focal shift (defocus) to obtain a 0.35-μm rectangular dense resist pattern within a variation of ±10% of the set dimensions.

(3) Total Process Margin

Using a mask substrate on which both an isolation pattern and a dense pattern were imaged, a sample was subjected to exposure and development at an exposure of Eop [the exposure time period to reproduce the set dimensions of mask pattern (line width 0.35 μm, line-and-space (L&S) 1:1)] as a standard exposure, where the focus was shifted up and down at this exposure. The obtained dense resist pattern (line width 0.35 μm, line-and-space (L&S) 1:1) and isolation resist pattern (size: 0.35 μm) were subjected to SEM photographic observation. Based upon the SEM photographs, the total process margin was defined as the maximum value (μm) of the focal shift (defocus) to obtain a 0.35-μm rectangular resist pattern within a variation of ±10% of the set dimensions both in the dense resist pattern and in the isolation resist pattern.

(4) Evaluation of Isolation Pattern Shape on Shift of Focal Depth to Minus Side

A sample was subjected to exposure and development at an exposure of Eop [the exposure time period to reproduce the set dimensions of mask pattern (line width 0.35 μm, line-and-space (L&S) 1:1)] as a standard exposure, where the focus was shifted 0.5 μm to the minus side (upside of the resist film). The obtained isolation resist pattern was subjected to SEM photographic observation.

(5) Definition

The definition was defined as the critical definition at an exposure which reproduced a 0.35-μm mask pattern with a L&S of 1:1.

EXAMPLE 1

Ingredient (A)

Alkali-soluble novolak resin [a mixture of 50 parts by weight of a novolak resin composed of m-cresol/2,5-xylenol=85/15 (by mole) and having a weight average molecular weight of 4200, and 50 parts by weight of a novolak resin composed of m-cresol/p-cresol/2,5-xylenol/5-methylresorcin=54/15/29/2 (by mole) and having a weight average molecular weight of 6500]

Ingredient (B)

A reaction product (diester content: 72%) of 1 mole of the following phenol compound and 2 moles of 1,2-naphthoquinonediazide- 5-sulfonyl chloride

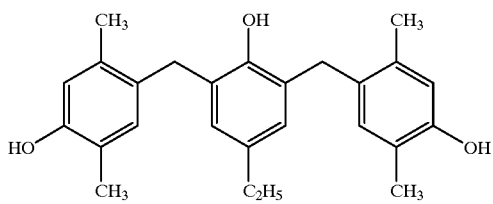

Ingredient (C)

Sensitizer (the following compound):

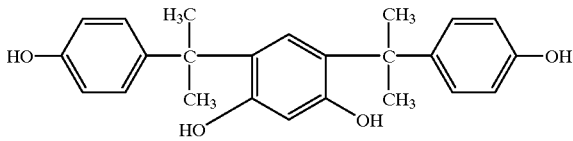

In 465 parts by weight of 2-heptanone, 100 parts by weight of the ingredient (A), 50 parts by weight of the ingredient (B), and 31 parts by weight of the ingredient (C) were dissolved, and the resulting solution was filtrated with a 0.2-μm membrane filter to yield a positive photoresist composition.

EXAMPLES 2 to 5 and COMPARATIVE EXAMPLES 1 to 3

A series of positive photoresist compositions were prepared in the same manner as in Example 1, except that the ingredient (B) used in Example 1 was changed to the compounds indicated in Table 1. The characteristics of these positive photoresist compositions were evaluated and the results are shown in Table 2.

TABLE 1

|  | Ingredient (B) (proportion) |
| --- | --- |
| Example 1 | B1 (100) |
| Example 2 | B1/B2 = (20/80) |
| Example 3 | B1/B2 = (40/60) |
| Example 4 | B1/B2/B3 = (20/40/40) |
| Example 5 | B1/B2/B3 = (40/40/20) |
| Comparative Example 1 | B4 (100) |
| Comparative Example 2 | B5 (100) |
| Comparative Example 3 | B2 (100) |

B1: A reaction product of 1 mole of the following phenol compound and 2 moles of 1,2-naphthoquinonediazide-5-sulfonyl chloride:

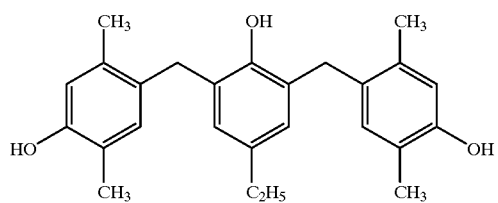

B2: A reaction product of 1 mole of the following phenol compound and 2 moles of 1,2-naphthoquinonediazide-5-sulfonyl chloride:

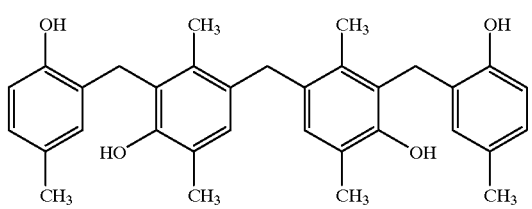

B3: A reaction product of 1 mole of the following phenol compound and 2 moles of 1,2-naphthoquinonediazide-5-sulfonyl chloride:

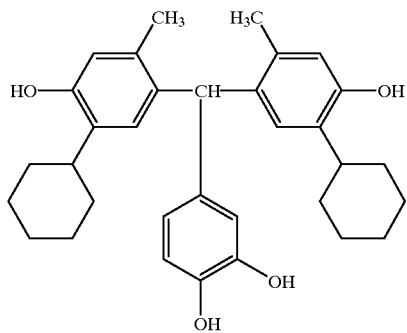

B4: A reaction product of 1 mole of the following phenol compound and 2 moles of 1,2-naphthoquinonediazide-5-sulfonyl chloride:

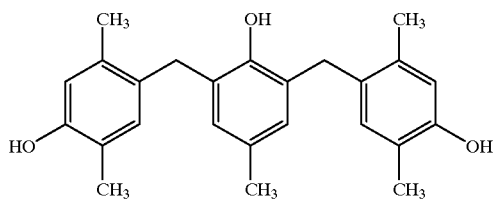

B5: A reaction product of 1 mole of the following phenol compound and 2 moles of 1,2-naphthoquinonediazide-5-sulfonyl chloride:

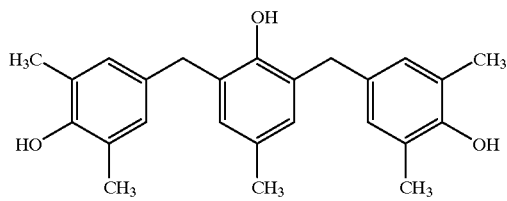

TABLE 2

| | Sensitivity (ms) | Depth of Focus Properties ($\mu$m) | | Total Process Margin | Isolation Pattern Shape On Minus Side | Definition ($\mu$m) |
|---|---|---|---|---|---|---|
| | | Isolation Pattern | Dense Pattern | | | |
| Ex. 1 | 480 | 1.0 | 0.8 | 0.8 | *1 | 0.32 |
| Ex. 2 | 420 | 0.8 | 1.0 | 0.8 | *1 | 0.28 |
| Ex. 3 | 440 | 0.9 | 1.0 | 0.9 | *1 | 0.30 |
| Ex. 4 | 350 | 0.8 | 1.0 | 0.8 | *1 | 0.28 |
| Ex. 5 | 380 | 0.9 | 1.0 | 0.9 | *1 | 0.30 |
| Comp. Ex. 1 | 430 | 0.6 | 1.2 | 0.6 | *2 | 0.28 |
| Comp. Ex. 2 | 410 | 0.6 | 1.2 | 0.6 | *2 | 0.28 |
| Comp. Ex. 3 | 400 | 0.6 | 1.2 | 0.6 | *2 | 0.28 |

*1 the following shape:

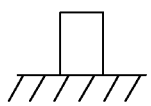

*2 the following shape:

Other embodiments and variations will be obvious to those skilled in the art, and this invention is not to be limited to the specific matters stated above.

What is claimed is:

1. A positive photoresist composition comprising:

(A) an alkali-soluble resin; and (B) a photosensitizer, said photosensitizer comprising an ester of a 1,2-naphthoquinonediazidesulfonyl compound with a compound of the following formula (I):

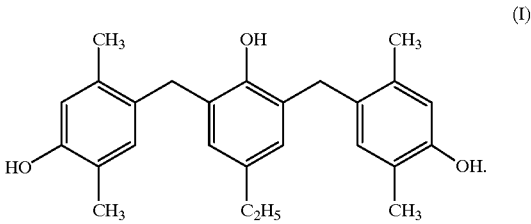

2. A positive photoresist composition according to claim 1, wherein said photosensitizer (B) further comprises an ester of a 1,2-naphthoquinonediazidesulfonyl compound with bis[2,5-dimethyl-3-(2-hydroxy-5-methylbenzyl)-4-hydroxyphenyl]methane of the following formula (II):

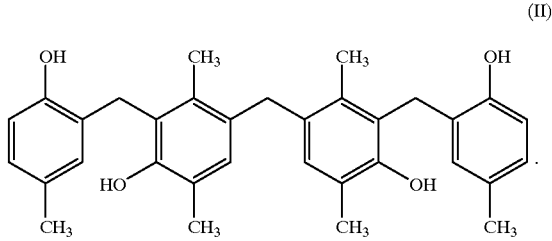

3. A positive photoresist composition according to claim 1, wherein said photosensitizer (B) further comprises an ester of a 1,2-naphthoquinonediazidesulfonyl compound with bis(3-cyclohexyl-4-hydroxy-6-methylphenyl)-3,4-dihydroxyphenylmethane of the following formula (III):

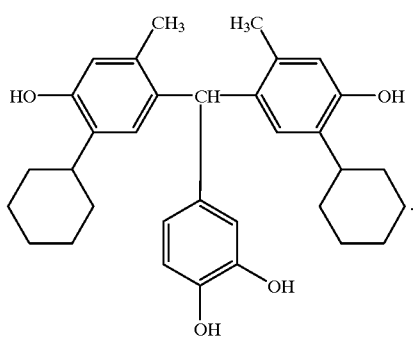

(III)

4. A positive photoresist composition according to claim 1, wherein said photosensitizer (B) further comprises an ester of a 1,2-naphthoquinonediazidesulfonyl compound with the phenol compounds of the formula (II) and (III).

5. A positive photoresist composition according to claim 1, further comprising (C) a sensitizer (intensifier).

6. A positive photoresist composition according to claim 1, wherein the proportion of said photosensitizer (B) ranges from 10% to 60% by weight relative to the weight of the alkali-soluble resin (A).

7. A positive photoresist composition according to claim 5, wherein the proportion of said photosensitizer (B) ranges from 10% to 60% by weight relative to the total weight of the alkali-soluble resin (A) and the sensitizer (C).

8. A positive photoresist composition according to claim 5, wherein the proportion of said sensitizer (C) ranges from 5% to 50% by weight relative to the weight of the alkali soluble resin ingredient (A).

9. A positive photoresist composition according to claim 1, wherein said photosensitizer (B) comprises 10% by weight or more of a diester of a 1,2-naphthoquinonediazidesulfonyl compound with the compound of the formula (I) based on the total weight of the photosensitizer (B).

10. A positive photoresist composition according to claim 2, wherein said photosensitizer (B) comprises 10% by weight or more of a diester of a 1,2-naphthoquinonediazidesulfonyl compound with the compound of the formula (II) based on the total weight of the photosensitizer (B).

11. A positive photoresist composition according to claim 3, wherein said photosensitizer (B) comprises 10% by weight or more of a diester of a 1,2-naphthoquinonediazidesulfonyl compound with the compound of the formula (III) based on the total weight of the photosensitizer (B).

12. A positive photoresist composition according to claim 4, wherein said photosensitizer (B) comprises 10% by weight or more of a diester of a 1,2-naphthoquinonediazidesulfonyl compound with the phenol compounds of the formula (II) and (III) based on the total weight of the photosensitizer (B).

* * * * *